(12) United States Patent
Choi et al.

(10) Patent No.: US 8,816,331 B2
(45) Date of Patent: Aug. 26, 2014

(54) ORGANIC LIGHT-EMITTING DISPLAY APPARATUS

(75) Inventors: Jun-Ho Choi, Yongin (KR); Jin-Koo Chung, Yongin (KR); Gun-Shik Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 10 days.

(21) Appl. No.: 13/268,273

(22) Filed: Oct. 7, 2011

(65) Prior Publication Data

US 2012/0280215 A1 Nov. 8, 2012

(30) Foreign Application Priority Data

May 3, 2011 (KR) ........................ 10-2011-0041991

(51) Int. Cl.
*H01L 29/08* (2006.01)

(52) U.S. Cl.
USPC .. 257/40; 257/59; 257/E27.119; 257/E33.055

(58) Field of Classification Search
USPC ................. 257/40, E51.005, 59, E27.119, 257/E33.055; 438/149
See application file for complete search history.

(56) References Cited

U.S. PATENT DOCUMENTS

| | | | |
|---|---|---|---|
| 7,268,488 B2 | 9/2007 | Ryu | |
| 7,446,338 B2 * | 11/2008 | Shirasaki et al. | 257/72 |
| 7,623,112 B2 * | 11/2009 | Chen et al. | 345/104 |
| 7,667,169 B2 * | 2/2010 | Yang et al. | 250/201.2 |
| 7,688,410 B2 | 3/2010 | Kim et al. | |
| 2005/0237455 A1 | 10/2005 | Fujioka et al. | |
| 2006/0119252 A1 | 6/2006 | Kawabe | |
| 2006/0124828 A1 * | 6/2006 | Shin | 250/205 |
| 2006/0238327 A1 * | 10/2006 | Repetto et al. | 340/461 |
| 2009/0225058 A1 * | 9/2009 | Tateuchi et al. | 345/175 |
| 2009/0284505 A1 * | 11/2009 | Tateuchi et al. | 345/207 |
| 2010/0102301 A1 * | 4/2010 | Yang et al. | 257/40 |
| 2011/0043464 A1 * | 2/2011 | Lee et al. | 345/173 |
| 2011/0050645 A1 * | 3/2011 | Lee et al. | 345/175 |

FOREIGN PATENT DOCUMENTS

| | | | |
|---|---|---|---|
| JP | 2005-331926 A | 12/2005 | |
| JP | 2006-147182 A | 6/2006 | |
| KR | 10-2005-0025509 A | 3/2005 | |
| KR | 10-2005-0072310 A | 7/2005 | |

* cited by examiner

*Primary Examiner* — Andy Huynh
(74) *Attorney, Agent, or Firm* — Lee & Morse, P.C.

(57) ABSTRACT

An organic light-emitting display apparatus including: a substrate; a plurality of pixels on a first surface of the substrate, each pixel of the pixels having a first region in which visible rays are emitted and a second region through which external light penetrates, such that the plurality of pixels provide a plurality of first and second regions; a plurality of pixel circuit units in the first region of each pixel, each pixel circuit unit of the pixel circuit units including at least one thin film transistor (TFT); a plurality of first electrodes independently disposed in the first region of each pixel, each first electrode of the first electrodes being electrically connected to each pixel circuit unit; a second electrode facing the first electrodes, the second electrode being electrically connected throughout the pixels; and an intermediate layer including an organic emitting layer between the first electrodes and the second electrode.

20 Claims, 8 Drawing Sheets

ORGANIC LIGHT-EMITTING DISPLAY APPARATUS

CROSS-REFERENCE TO RELATED PATENT APPLICATION

This application claims the benefit of Korean Patent Application No. 10-2011-0041991, filed on May 3, 2011, in the Korean Intellectual Property Office, the disclosure of which is incorporated herein in its entirety by reference.

BACKGROUND

1. Field

Embodiments relate to an organic light-emitting display apparatus.

2. Description of the Related Art

Display apparatuses are being replaced with portable, slim flat panel display apparatuses. Among various flat panel display apparatuses, an organic light-emitting display apparatus is a self-luminescent display apparatus having wide viewing angles, excellent contrast, and short response times. Therefore, an organic light-emitting display apparatus may be applied to various fields.

SUMMARY

According to an embodiment, there may be an organic light-emitting display apparatus including a substrate; a plurality of pixels on a first surface of the substrate, each pixel of the plurality of pixels having a first region in which visible rays are emitted and a second region through which external light penetrates, such that the plurality of pixels provide a plurality of first and second regions; a plurality of pixel circuit units in the first region of each pixel, each pixel circuit unit of the plurality of pixel circuit units including at least one thin film transistor (TFT); a plurality of first electrodes independently disposed in the first region of each pixel, each first electrode of the plurality of first electrodes being electrically connected to each pixel circuit unit; a second electrode facing the first electrodes, the second electrode being electrically connected throughout the pixels; and an intermediate layer including an organic emitting layer between the first electrodes and the second electrode, wherein second regions included in at least two adjacent pixels of the pixels in a first direction are integrally connected to form a plurality of second region groups obliquely disposed relative to each other in the first direction.

Every second one of the plurality of second region groups is mutually aligned in the first direction.

Second region groups adjacent to each other in a second direction perpendicular to the first direction may be parallel to each other.

The second region groups may be formed by integrally connecting second regions included in three adjacent pixels in the first direction.

At least two second region groups adjacent to each other in a second direction perpendicular to the first direction may be integrally connected to form a plurality of second region group sets.

The second region group sets may be obliquely disposed relative to each other in the first direction.

Every second one of the plurality of second region group sets may be mutually aligned in the first direction.

The second region group sets adjacent to each other in the second direction perpendicular to the first direction may be parallel to each other.

The first electrodes may include light penetration electrodes.

The first electrodes may include light reflection electrodes.

The second electrode may include a plurality of first penetration windows in positions corresponding to the second regions.

The first penetration windows may be formed corresponding to the second region groups.

The organic light-emitting display apparatus may further include: at least one insulation film between the substrate and the second electrode, wherein the insulation film includes a plurality of second penetration windows corresponding to the plurality of second region groups.

The first region of each pixel may include a light-emitting region and a circuit region, the at least one TFT is disposed in the circuit region, the plurality of first electrodes are disposed in the light-emitting region, and the light-emitting region and the circuit region of each pixel are adjacent to each other.

The first region of each pixel may include a light-emitting region and a circuit region, the plurality of pixel circuit units are disposed in the circuit region, the plurality of first electrodes are disposed in the light-emitting region, and the light-emitting region overlaps the circuit region to cover the circuit region.

A first area of each first electrode of each pixel may be a same area as a second area of the first region.

BRIEF DESCRIPTION OF THE DRAWINGS

The above and other features will become more apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein.

Figure 1:
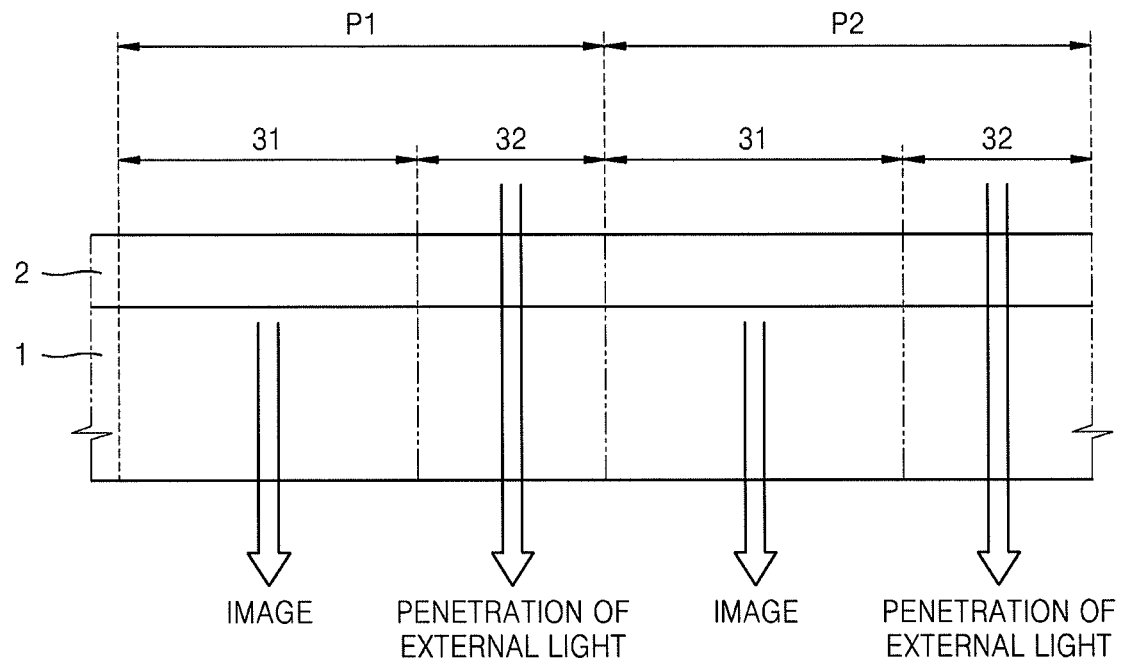
FIG. 1 is a schematic cross-sectional view of an organic light-emitting display apparatus according to an embodiment.

FIG. 1 is a schematic cross-sectional view of an organic light-emitting display apparatus according to an embodiment.

Referring to FIG. 1, the organic light-emitting display apparatus includes a display unit 2 disposed on a substrate 1.

In the organic light-emitting display apparatus, an external light penetrates through the substrate 1 and the display unit 2. Also, the display unit 2 is configured such that the external light penetrates therethrough. As shown in FIG. 1, a user located at a side where an image is realized may be able to view an image of an upper external side of the substrate 1.

Figure 2:
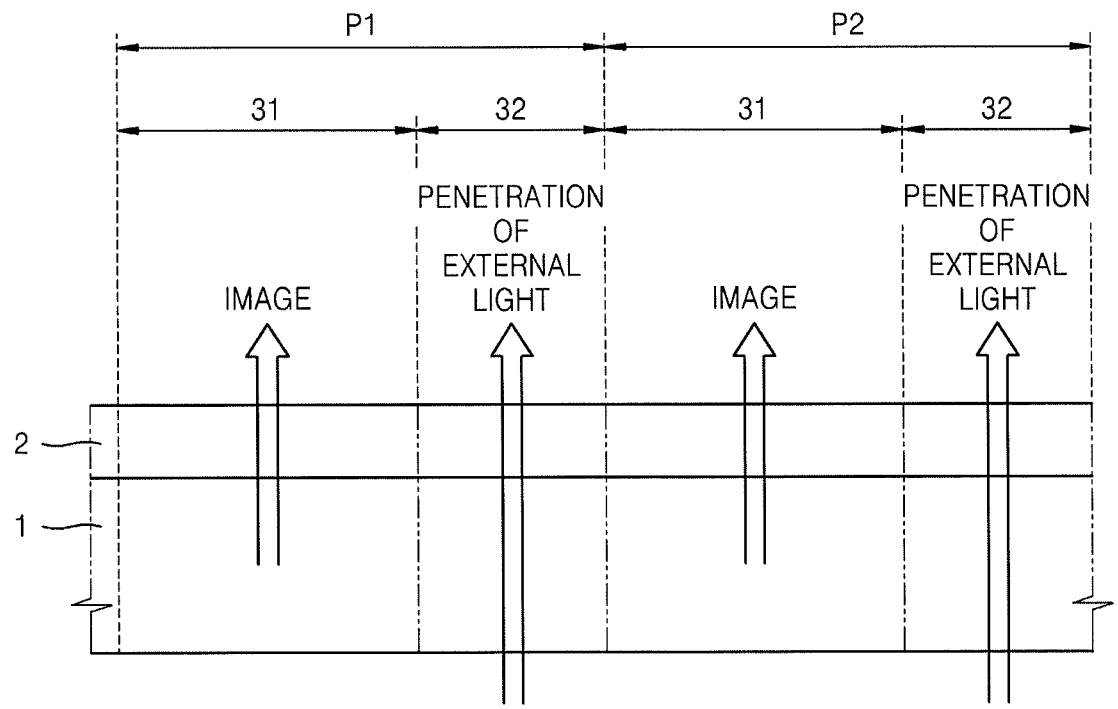
FIG. 2 is a schematic cross-sectional view of an organic light-emitting display apparatus according to another embodiment.

The organic light-emitting display apparatus of FIG. 1 is a bottom-emission type, wherein the image of the display unit 2 is realized toward the substrate 1. Alternatively, as shown in FIG. 2, the organic light-emitting display apparatus may be a top-emission type, wherein the image of the display unit 2 is realized in an opposite direction of the substrate 1. Here, the user may view the image of the display unit 2 above the substrate 1, and an external image under the substrate 1. However, the type of the organic light-emitting display apparatus is not limited thereto. The type of the organic light-emitting display apparatus may be a two-sided emission type, wherein the image of the display unit 2 is realized toward and in an opposite direction of the substrate 1.

FIGS. 1 and 2 show a first pixel P1 and a second pixel P2, which are two adjacent pixels of the organic light-emitting display apparatus.

Each of the first and second pixels P1 and P2 includes a first region 31 and a second region 32. The image is formed on the display unit 2 through the first region 31, and the external light penetrates through the second region 32.

In other words, both the first and second pixels P1 and P2 include the first region 31 that realizes the image and the second region 32 through which the external light penetrates. Thus, the user may view an external image when not viewing the image formed on the display unit 2.

Here, devices, such as a thin film transistor (TFT), a capacitor, and an organic light-emitting device, are not formed in the second region 32 so as to maximize external light transmittance in the second region 32, thereby increasing external light transmittance of the display unit 2. Also, distortion of an external penetrated image due to the devices, i.e., the TFT, the capacitor, and the organic light-emitting device, may be reduced.

Figure 3:
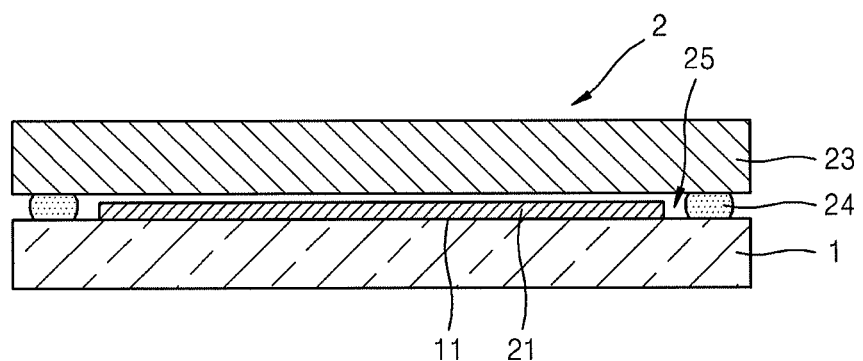
FIG. 3 is a cross-sectional view illustrating in detail the organic light-emitting display apparatus of FIG. 1 or 2, according to an embodiment.

FIG. 3 is a cross-sectional view illustrating in detail the organic light-emitting display apparatus of FIG. 1 or 2, according to an embodiment. Referring to FIG. 3, the display unit 2 includes an organic light-emitter 21 formed on a first surface 11 of the substrate 1 and a sealing substrate 23 sealing the organic light-emitter 21.

The sealing substrate 23 is formed of a transparent material so that the image is realized from the organic light-emitter, and prevents any external air or moisture from penetrating into the organic light-emitter.

Boundaries of the substrate 1 and the display unit 2 are combined with the sealing material 24. Thus, a space 25 between the substrate 1 and the sealing substrate 23 are sealed. A moisture absorbent or a filling material may be disposed in the space 25.

Figure 4:
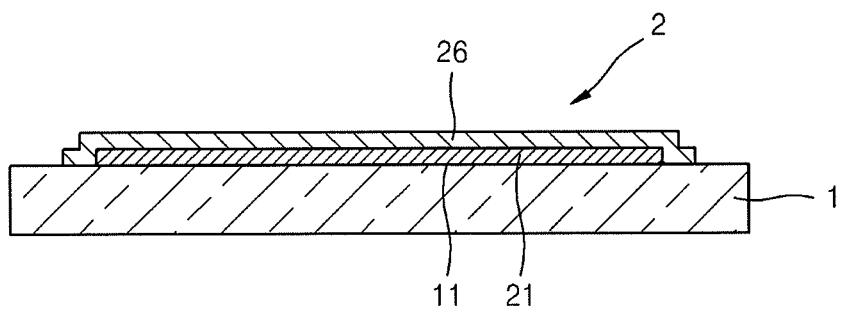
FIG. 4 is a cross-sectional view illustrating in detail the organic light-emitting display apparatus of FIG. 1 or 2, according to another embodiment.

As shown in FIG. 4, a sealing film 26, instead of the sealing substrate 23, may be formed on the organic light-emitter 21 so as to protect the organic light-emitter 21 from external air. The sealing film 26 may have a structure in which a film formed of an inorganic material, and a film formed of an organic material, are alternately stacked on each other. However, the structure of the sealing film 26 is not limited thereto, and may have any sealing structure formed of a transparent thin film.

Although not shown, the sealing substrate 23 of FIG. 3 may be formed on the sealing film 26 of FIG. 4 as a sealing structure with respect to the organic light-emitter 21.

Reflection prevention films for preventing external light from being reflected may be respectively formed in a bottom surface of the substrate 1 and a top external surface of the display unit 2.

Next, the organic light-emitter 21 according to embodiments will be described.

Figure 5:
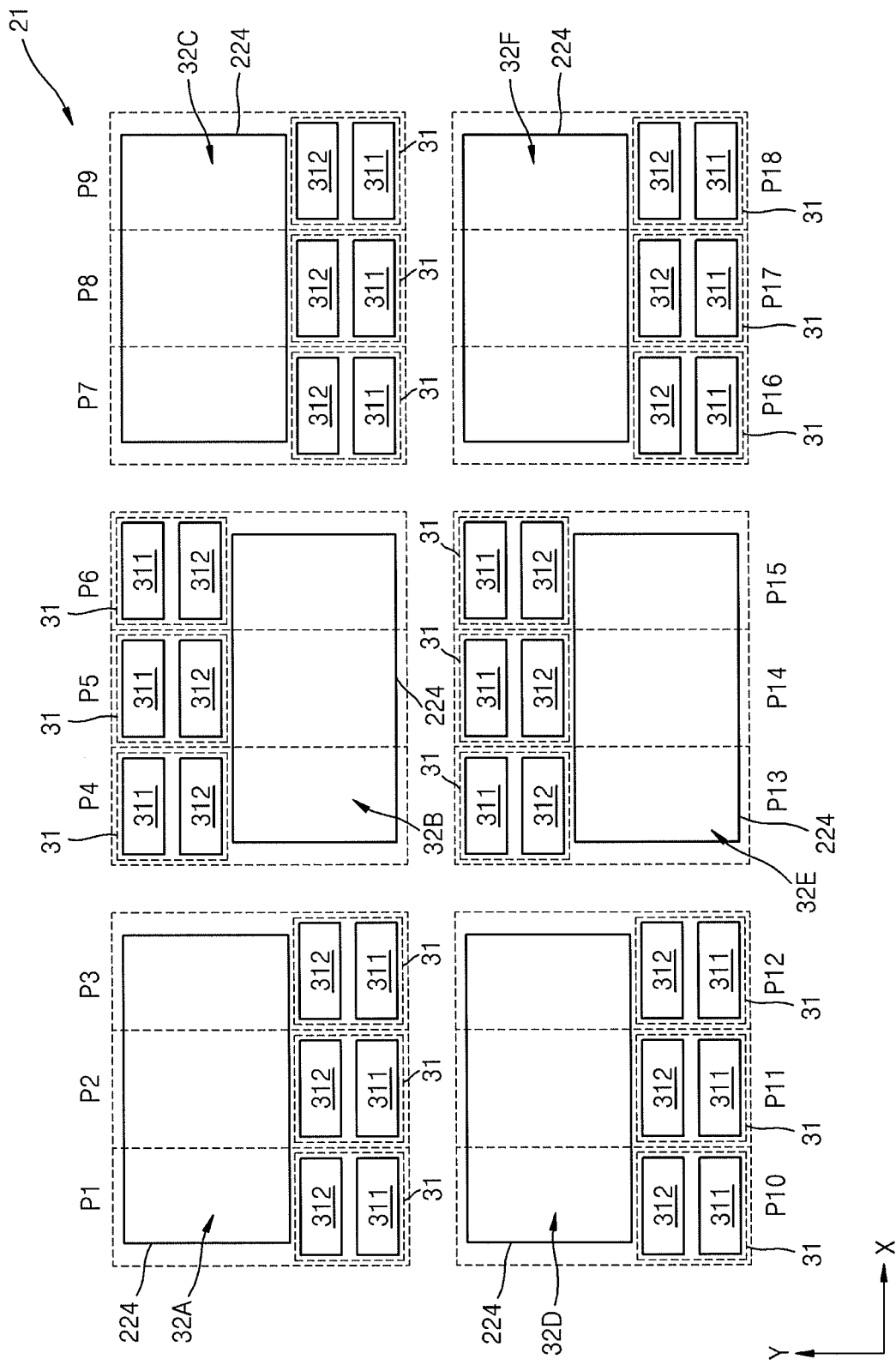
FIG. 5 is a schematic plan view of an organic light-emitter of FIG. 3 or 4, according to an embodiment.

FIG. 5 is a schematic plan view of the organic light-emitter 21 of FIG. 3 or 4, according to an embodiment. More specifically, FIG. 5 is a schematic plan view of a first pixel P1, a second pixel P2, a third pixel P3, a fourth pixel P4, a fifth pixel P5, a sixth pixel P6, a seventh pixel P7, an eighth pixel P8, a ninth pixel P9, a tenth pixel P10, an eleventh pixel P11, a twelfth pixel P12, a thirteenth pixel P13, a fourteenth pixel P14, a fifteenth pixel P15, a sixteenth pixel P16, a seventeenth pixel P17, and an eighteenth pixel P18 of the organic light-emitter 21 that are adjacent to each other.

Each of the first through eighteenth pixels P1 through P18 includes a circuit region 311 and a light-emitting region 312 in the first region 31. The circuit region 311 and the light-emitting region 312 are disposed to be adjacent to each other.

Also, the second regions 32 allowing the external light to penetrate therethrough are disposed to be adjacent to the first regions 31. Second region groups 32A, 32B, 32C, 32D, 32E, and 32F are formed by integrally connecting the second regions 32 that are adjacent to each other.

For descriptive convenience, in FIG. 5, no reference numeral denotes the second regions 32 for a pixel as shown in FIGS. 1 and 2, and the second regions 32 are shown as the second region groups 32A, 32B, 32C, 32D, 32E, and 32F formed by integrally connecting the second regions 32 that are adjacent to each other.

The second region groups 32A, 32B, 32C, 32D, 32E, and 32F will now be described in detail below.

The first pixel P1, the second pixel P2, and the third pixel P3 are adjacent to each other in a first direction (in an X axial direction of FIG. 5). The second regions included in the first pixel P1, the second pixel P2, and the third pixel P3 are integrally connected to form the second region group A 32A.

The pixel P4, the fifth pixel P5, and the sixth pixel P6 are adjacent to each other in the first direction. The second regions included in the pixel P4, the fifth pixel P5, and the sixth pixel P6 are integrally connected to form the second region group B 32B.

The seventh pixel P7, the eighth pixel P8, and the ninth pixel P9 are adjacent to each other in the first direction. The second regions included in the seventh pixel P7, the eighth pixel P8, and the ninth pixel P9 are integrally connected to form the second region group C 32C.

The tenth pixel P10, the eleventh pixel P11, and the twelfth pixel P12 that are adjacent to the first pixel P1, the second pixel P2, and the third pixel P3 in a second direction (in a Y axial direction of FIG. 5) are adjacent to each other in the first direction (in the X axial direction of FIG. 5). The second regions included in the tenth pixel P10, the eleventh pixel P11, and the twelfth pixel P12 are integrally connected to form the second region group D 32D.

The thirteenth pixel P13, the fourteenth pixel P14, and the fifteenth pixel P15 that are adjacent to the fourth pixel P4, the fifth pixel P5, and the sixth pixel P6 in the second direction are adjacent to each other in the first direction. The second regions included in the thirteenth pixel P13, the fourteenth pixel P14, and the fifteenth pixel P15 are integrally connected to form the second region group E 32E.

The sixteenth pixel P16, the seventeenth pixel P17, and the eighteenth pixel P18 that are adjacent to the seventh pixel P7, the eighth pixel P8, and the ninth pixel P9 in the second direction are adjacent to each other in the first direction. The second regions included in the sixteenth pixel P16, the seventeenth pixel P17, and the eighteenth pixel P18 are integrally connected to form the second region group F 32F.

The second regions are connected to each other throughout three adjacent pixels, so that an area of the second regions through which the external light penetrates may be increased. Thus, transmittance of the display unit 2 may be increased.

Although the second regions are connected to each other throughout three adjacent pixels in FIG. 5, present embodiments are not limited thereto. The second regions may be integrally connected to each other throughout at least two adjacent pixels to form second region groups.

The second region groups 32A, 32B, 32C, 32D, 32E, and 32F are obliquely disposed relative to each other in the first direction. Every second one of the second region groups 32A, 32B, 32C, 32D, 32E, and 32F are disposed in line with each other in the first direction.

More specifically, the second region group A 32A, the second region group B 32B, and the second region group C 32C are not disposed in line with each other but are disposed obliquely relative to each other. However, the second region group A 32A and the second region group C 32C of every other line are disposed in line with each other. Although not shown, the arrangement of the second region group A 32A, the second region group B 32B, and the second region group C 32C may be continuously repeated.

The second region group D 32D, the second region group E 32E, and the second region group F 32F are not disposed in line with each other but are disposed obliquely relative to each other. However, the second region group D 32D and the second region group F 32F of every other line are disposed in line with each other. Although not shown, the arrangement of the second region group D 32D, the second region group E 32E, and the second region group F 32F may be continuously repeated.

The second region groups 32A, 32B, 32C, 32D, 32E, and 32F that are adjacent to each other in the second direction are disposed in parallel with each other.

That is, the second region group A 32A and the second region group D 32D are disposed in parallel with each other, the second region group B 32B and the second region group E 32E are disposed in parallel with each other, and the second region group C 32C and the second region group F 32F are disposed in parallel with each other.

If the second region groups 32A, 32B, 32C, 32D, 32E, and 32F are disposed in line with each other in the first direction, spaces between the second region groups 32A, 32B, 32C, 32D, 32E, and 32F disposed in line with each other in the first direction are much greater than those therebetween disposed in parallel with each other in the second direction. Thus, this may cause image distortion when a user views an image through the second region groups 32A, 32B, 32C, 32D, 32E, and 32F.

However, in present embodiments, the second region groups 32A, 32B, 32C, 32D, 32E, and 32F are disposed obliquely relative to each other in the first direction, in particular, every second one thereof are disposed in line with each other in the first direction. Thus, differences in the spaces therebetween in the first direction and in the second direction are reduced, thereby reducing the image distortion.

Figure 6:
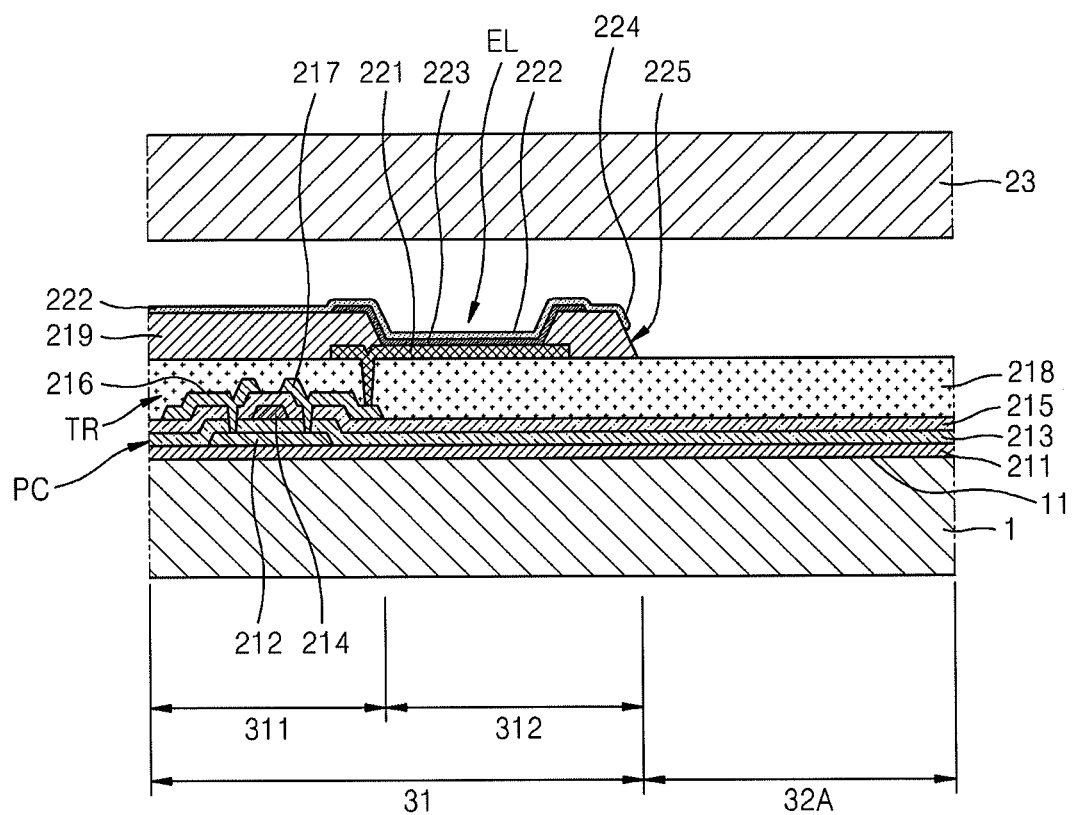
FIG. 6 is a cross-sectional view of a pixel of the organic light-emitter of FIG. 5, according to an embodiment.

FIG. 6 is a cross-sectional view of the first pixel P1 of the first through eighteenth pixels P1 through P18 of FIG. 5, according to an embodiment. Referring to FIG. 6, a pixel circuit unit PC including a TFT TR is disposed in the circuit region 311. Although one TFT TR is shown in FIG. 6, present embodiments are not limited thereto. The pixel circuit unit PC may further include a plurality of other TFTs, aside from the TFT TR, a storage capacitor, and wires, i.e., a scan line, a data line, and a Vdd line, which are connected to the TFTs and the storage capacitor.

The organic light-emitting device EL constituting a light-emitting device is disposed in the light-emitting region 312. The organic light-emitting device EL is electrically connected to the TFT TR of the pixel circuit unit PC.

A buffer film 211 is formed on the substrate 1, and the pixel circuit unit PC including the TFT TR is formed on the buffer film 211.

First, a semiconductor active layer 212 is formed on the buffer film 211. The buffer film 211 is formed of any transparent insulating material, which prevents penetration of an impure element and smoothens a surface of the buffer film 211. For example, the buffer film 211 may be formed of an inorganic material, i.e., a silicon oxide, a silicon nitride, a silicon oxynitride, an aluminum oxide, an aluminum nitride, a titanium oxide, or a titanium nitride, an organic material, such as polyimide, polyester, acryl, or a stacked structure of the inorganic material and the organic material. The buffer film 211 is not an essential element, and may not be included.

The semiconductor active layer 212 may be formed of polycrystalline silicon, but is not limited thereto. The semiconductor active layer 212 may be formed of an oxide semiconductor. For example, the semiconductor active layer 212 may be a G—I—Z—O layer [$(In_2O_3)a(Ga_2O_3)b(ZnO)c$ layer], wherein a, b, and c are each a real number satisfying a≥0, b≥0, c>0. When the semiconductor active layer 212 is formed of an oxide semiconductor, transmittance of external light of the circuit region 311 of the first region 31 may be increased. Thus, external light transmittance of the display unit 2 may be increased.

A gate insulation film 213, which is formed of a transparent insulating material, is formed on the buffer film 211 to cover the semiconductor active layer 212. A gate electrode 214 is formed on the gate insulation film 213.

An interlayer insulation film 215, which is formed of a transparent insulating material, is formed on the gate insulation film 213 to cover the gate electrode 214, and a source electrode 216 and a drain electrode 217 are formed on the interlayer insulation film 215, each contacting the semiconductor active layer 212 via a hole.

The structure of the TFT TR is not limited thereto, and may vary.

A passivation film 218 is formed to cover the pixel circuit unit PC including the TFT TR. The passivation film 218 may be a single or plurality of insulation films, wherein a top surface is smooth. The passivation film 218 may be formed of a transparent inorganic insulating material and/or organic insulating material. The passivation film 218 may be formed throughout all pixels.

As shown in FIG. 6, a first electrode 221 of the organic light-emitting device EL electrically connected to the TFT TR is formed on the passivation film 218. The first electrode 221 is formed in an individual and independent island form with respect to all pixels.

A pixel definition film 219 formed of an organic and/or inorganic insulating material is formed on the passivation film 218. The pixel definition film 219 covers a boundary and exposes a predetermined region of the first electrode 221. The pixel definition film 219 may cover the first region 31, and may cover only a part of the first electrode 221. The part of the first electrode 221 may specifically be the boundary of the first electrode 221, and not the entire first region 31.

An intermediate layer 223 and a second electrode 222 are sequentially stacked on the first electrode 221. The second electrode 222 is formed on the intermediate layer 223 and the pixel definition film 219, and is electrically connected throughout all pixels.

The organic light emitting layer included in the intermediate layer 223 may be a low molecular or high molecular organic film. The low molecular organic film may have a single or complex structure, in which a hole injection layer (HIL), a hole transport layer (HTL), an emission layer (EML), an electron transport layer (ETL), and an electron injection layer (EIL) are stacked on each other, and may be formed of an organic material, i.e., copper phthalocyanine (CuPc), N,N'-Di(naphthalene-1-yl)-N,N'-diphenyl-benzidine (NPB), or tris-8-hydroxyquinoline aluminum (Alq3). In this case, the intermediate layer 23 may be formed in various ways. Here, the HIL, the HTL, the ETL, and the EIL are common layers and may be formed in all pixels irrespective of their colors.

The first electrode 221 operates as an anode and the second electrode 222 operates as a cathode. Alternatively, polarities of the first and second electrodes 221 and 222 may be changed.

The first electrode 221 may be a transparent electrode and the second electrode 222 may be a reflective electrode. The first electrode 221 may be formed of indium tin oxide (ITO), an indium zinc oxide (IZO), zinc oxide (ZnO), or indium oxide (In2O3), which have a high work function. Also, the second electrode 222 may be formed of a metal having a low work function, i.e., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Accordingly, the organic light-emitting device EL is a bottom emission type realizing an image in a direction of the first electrode 221.

However, alternatively, the second electrode 222 may also be a transparent electrode.

As described above, the passivation film 218, the gate insulation film 213, the interlayer insulation film 215, and the pixel definition film 219 may each be a transparent insulation film so as to increase external light transmittance. The sealing substrate 23 may be disposed above the second electrode 222. As shown in FIG. 3, the sealing substrate 23 is combined to the substrate 1 by using the separate sealing material 24 in the boundary of the display unit 2, so as to seal the organic light-emitter 21 from external air. A separate filling material (not shown) or a moisture absorbent may be disposed in a space between the sealing substrate 23 and the second electrode 222. However, a sealing structure of the display unit 2 is not limited to using the sealing substrate 23 of FIG. 6. The sealing film of FIG. 3 may be alternatively used.

Meanwhile, the second electrode 222 and the pixel definition film 219 may respectively include a first penetrating window 224 and a second penetrating window 225. The first penetrating window 224 may be formed by removing a portion of the second electrode 222, which corresponds to the second region 32. The second penetrating window 225 may be formed by removing a portion of the pixel definition film 219, which corresponds to the second region 32. The first and second penetrating windows 224 and 225 may be connected to each other.

The first penetrating window 224 and the second penetrating window 225 may be formed in island patterns. As shown in FIG. 5, the first penetrating window 224 and the second penetrating window 225 may be formed throughout adjacent pixels and, in particular, corresponding to the second region groups 32A, 32B, 32C, 32D, 32E, and 32F. In this regard, the first penetrating window 224 is only shown in FIG. 5 for descriptive convenience, the second penetrating window 225 may be formed in a pattern corresponding to the second region groups 32A, 32B, 32C, 32D, 32E, and 32F.

The second penetrating window 225 may be further formed in at least one of the passivation film 218, the interlayer insulation film 215, the gate insulation film 213, and the buffer film 211. However, the first and second penetrating windows 224 and 225 do not have to exist together, and any one of the first and second penetrating windows 224 and 225 may be formed. Here, only the first penetrating window 224 may be formed so as to increase transmittance of external light.

Present embodiments are not limited thereto, and the first penetrating window 224 and the second penetrating window 225 may be formed by removing predetermined thicknesses of portions of the second electrode 222 and the pixel definition film 219 corresponding to the second region 32 rather than completely removing the portions.

Figure 7:
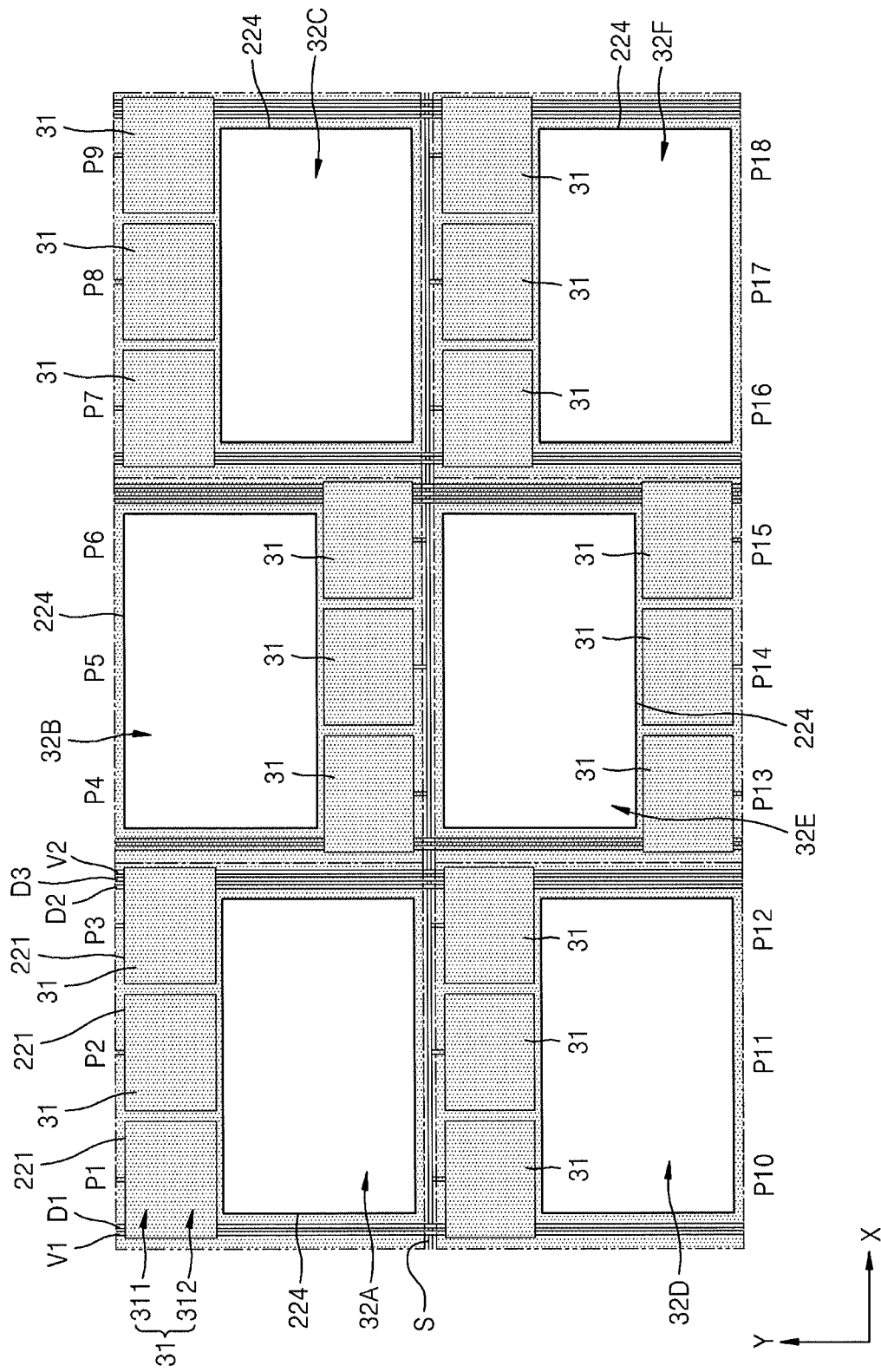
FIG. 7 is a schematic plan view of the organic light-emitter of FIG. 3 or 4, according to another embodiment.

FIG. 7 is a schematic plan view of the organic light-emitter 21 of FIG. 3 or 4, according to an embodiment. More specifically, FIG. 7 is a schematic plan view of the first pixel P1, the second pixel P2, the third pixel P3, the fourth pixel P4, the fifth pixel P5, the sixth pixel P6, the seventh pixel P7, the eighth pixel P8, the ninth pixel P9, the tenth pixel P10, the eleventh pixel P11, the twelfth pixel P12, the thirteenth pixel P13, the fourteenth pixel P14, the fifteenth pixel P15, the sixteenth pixel P16, the seventeenth pixel P17, and the eighteenth pixel P18 of the organic light-emitter 21 that are adjacent to each other.

Each of the first through eighteenth pixels P1 through P18 includes a circuit region 311 and a light-emitting region 312 in the first region 31. The circuit region 311 and the light-emitting region 312 are disposed to overlap with each other.

Also, the second regions, through which the external light penetrates, are disposed to be adjacent to the first regions 31. The second region groups 32A, 32B, 32C, 32D, 32E, and 32F are formed by integrally connecting the second regions 32 that are adjacent to each other.

The first through eighteenth pixels P1 through P18 each include the first electrode 221 that corresponds to the first region 31.

A scan line S extends in a first direction (in an X axial direction of FIG. 7) and is connected to each of the first through eighteenth pixels P1 through P18. First through third data lines D1 through D3 are electrically connected to the first electrodes 221 of the first through third pixels P1 through P3. A first Vdd line V1 is electrically connected to the first electrode 221 of the first pixel P1 and the first electrode 221 of the second pixel P2. A second Vdd line V2 is electrically connected to the first electrode 221 of the third pixel P3. Although not shown for descriptive convenience, data lines of the fourth through eighteenth pixels P4 through P18 and the first and second Vdd lines V1 and V2 are connected in a similar manner to the first through third pixels P1 through P3.

The second region groups 32A, 32B, 32C, 32D, 32E, and 32F will now be described in detail below.

The first pixel P1, the second pixel P2, and the third pixel P3 are adjacent to each other in the first direction (in the X axial direction of FIG. 7). The second regions included in the first pixel P1, the second pixel P2, and the third pixel P3 are integrally connected to form the second region group A 32A.

The pixel P4, the fifth pixel P5, and the sixth pixel P6 are adjacent to each other in the first direction. The second regions included in the pixel P4, the fifth pixel P5, and the sixth pixel P6 are integrally connected to form the second region group B 32B.

The seventh pixel P7, the eighth pixel P8, and the ninth pixel P9 are adjacent to each other in the first direction. The second regions included in the seventh pixel P7, the eighth pixel P8, and the ninth pixel P9 are integrally connected to form the second region group C 32C.

The tenth pixel P10, the eleventh pixel P11, and the twelfth pixel P12 that are adjacent to the first pixel P1, the second pixel P2, and the third pixel P3 in a second direction (in a Y axial direction of FIG. 7) are adjacent to each other in the first direction (in the X axial direction of FIG. 7). The second regions included in the tenth pixel P10, the eleventh pixel P11, and the twelfth pixel P12 are integrally connected to form the second region group D 32D.

The thirteenth pixel P13, the fourteenth pixel P14, and the fifteenth pixel P15 that are adjacent to the fourth pixel P4, the fifth pixel P5, and the sixth pixel P6 in the second direction are adjacent to each other in the first direction. The second regions included in the thirteenth pixel P13, the fourteenth pixel P14, and the fifteenth pixel P15 are integrally connected to form the second region group E 32E.

The sixteenth pixel P16, the seventeenth pixel P17, and the eighteenth pixel P18 that are adjacent to the seventh pixel P7, the eighth pixel P8, and the ninth pixel P9 in the second direction are adjacent to each other in the first direction. The second regions included in the sixteenth pixel P16, the seventeenth pixel P17, and the eighteenth pixel P18 are integrally connected to form the second region group F 32F.

The second regions are connected to each other throughout three adjacent pixels, so that an area of the second regions through which the external light penetrates, and thus transmittance of the display unit 2 may be increased.

Although the second regions are connected to each other throughout three adjacent pixels in FIG. 7, present embodiments are not limited thereto. The second regions may be integrally connected to each other throughout at least two adjacent pixels to form second region groups.

The second region groups 32A, 32B, 32C, 32D, 32E, and 32F are obliquely disposed relative to each other in the first direction. Every second one of the second region groups 32A, 32B, 32C, 32D, 32E, and 32F are disposed in line with each other in the first direction.

More specifically, the second region group A 32A, the second region group B 32B, and the second region group C 32C are not disposed in line with each other but are disposed obliquely relative to each other. However, the second region group A 32A and the second region group C 32C of every other line are disposed in line with each other. Although not shown in FIG. 7, the arrangement of the second region group A 32A, the second region group B 32B, and the second region group C 32C may be continuously repeated.

The second region group D 32D, the second region group E 32E, and the second region group F 32F are not disposed in line with each other but are disposed obliquely relative to each other. However, the second region group D 32D and the second region group F 32F of every other line are disposed in line with each other. Although not shown in FIG. 7, the arrangement of the second region group D 32D, the second region group E 32E, and the second region group F 32F may be continuously repeated.

The second region groups 32A, 32B, 32C, 32D, 32E, and 32F that are adjacent to each other in the second direction are disposed in parallel with each other.

That is, the second region group A 32A and the second region group D 32D are disposed in parallel with each other, the second region group B 32B and the second region group E 32E are disposed in parallel with each other, and the second region group C 32C and the second region group F 32F are disposed in parallel with each other.

However, in the present embodiment, the second region groups 32A, 32B, 32C, 32D, 32E, and 32F are disposed obliquely relative to each other in the first direction, in particular, every second one thereof are disposed in line with each other in the first direction, and thus differences in the spaces therebetween in the first direction and in the second direction are reduced, thereby reducing image distortion.

Figure 8:
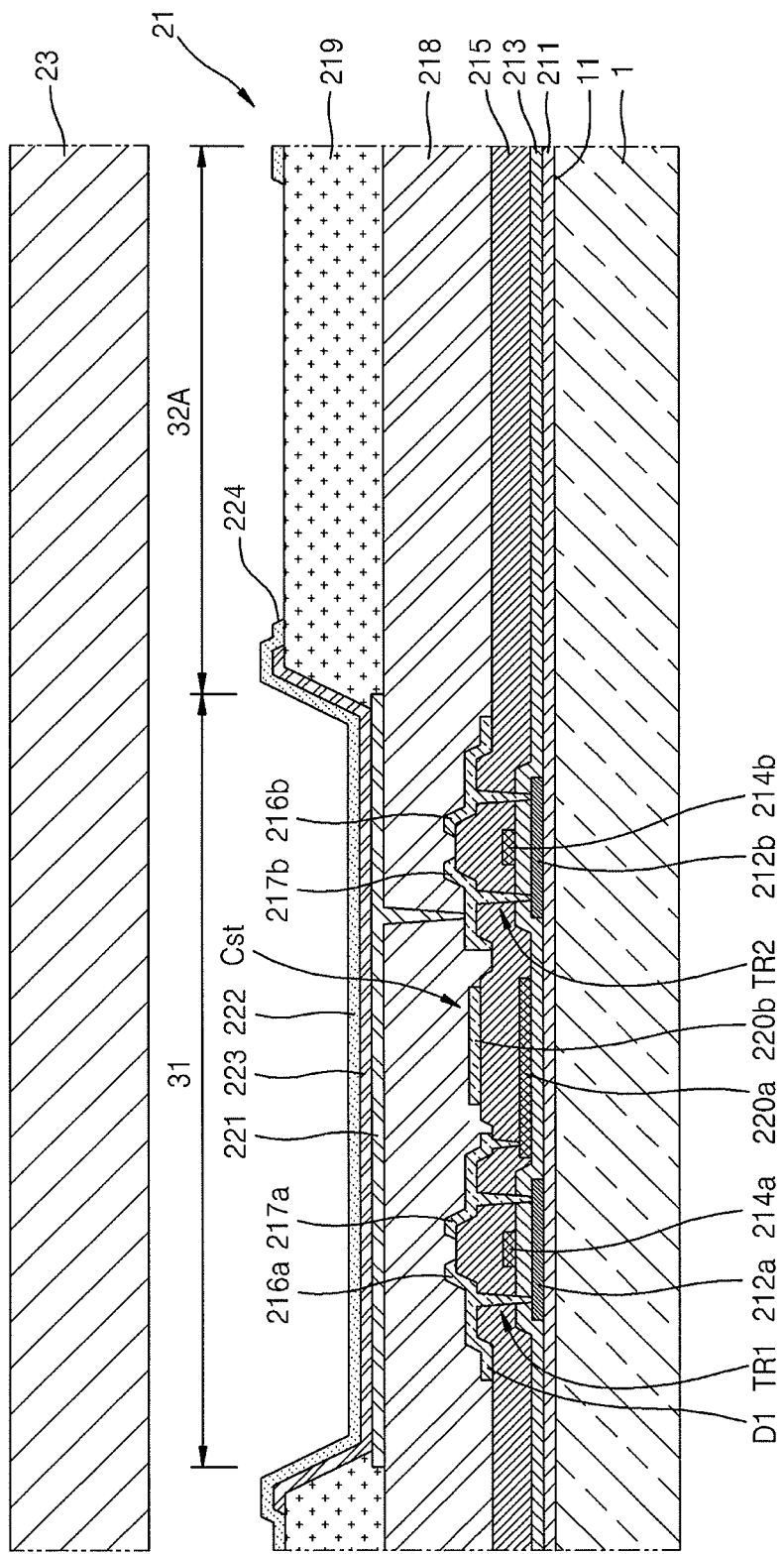
FIG. 8 is a cross-sectional view of a pixel of the organic light-emitter of FIG. 7, according to another embodiment.

FIG. 8 is a cross-sectional view of the first pixel P1 of the first through eighteenth pixels P1 through P18 of FIG. 7, according to an embodiment. Referring to FIG. 8, the pixel circuit unit PC including first and second TFTs TR1 and TR2 is disposed in the circuit region 311. Although now shown in FIG. 8, the pixel circuit unit PC may further include wires, such as a scan line, a data line, and a Vdd line.

Referring to FIG. 8, the buffer film 211 is formed on the first surface 11 of the substrate 1, and the first TFT TR1, a capacitor Cst, and the second TFT TR2 are formed on the buffer film 211.

First, a first semiconductor active layer 212*a* and a second semiconductor active layer 212*b* are formed on the buffer film 211.

The first semiconductor active layer 212*a* and the second semiconductor active layer 212*b* may be formed of polycrystalline silicon, but is not limited thereto, and may be formed of an oxide semiconductor. For example, the semiconductor active layer 212 may be a G—I—Z—O layer [$(In_2O_3)a(Ga_2O_3)b(ZnO)c$ layer], wherein a, b, and c are each a real number satisfying $a \geq 0$, $b \geq 0$, $c > 0$.

The gate insulation film 213 is formed on the buffer film 211 to cover the first semiconductor active layer 212*a* and the second semiconductor active layer 212*b*, and a first gate electrode 214*a* and a second gate electrode 214*b* are formed on the gate insulation film 213.

The interlayer insulation film 215 is formed on the gate insulation film 213 to cover the first gate electrode 214*a* and the second gate electrode 214*b*, and a first source electrode 216*a*, a second source electrode 216*b*, a first drain electrode 217*a*, and a second source electrode 217*b* are formed on the interlayer insulation film 215, each contacting the first semiconductor active layer 212*a* and the second semiconductor active layer 212*b* via a hole.

The scan line S may be formed simultaneously with the formation of the first gate electrode 214*a* and the second gate electrode 214*b*. The first data line D1 may be formed to be simultaneously connected to the first source electrode 216*a*. The first Vdd line V may be formed to be simultaneously connected to the second source electrode 216*b*.

A bottom electrode 220*a* of the capacitor Cst may be formed simultaneously with the formation of the first gate electrode 214*a* and the second gate electrode 214*b*. The top electrode 220*b* of the capacitor Cst may be formed simultaneously with the formation of the first drain electrode 217*a*.

The structures of the first TFT TR1, the capacitor Cst, and the second TFT TR2 are not limited thereto, and may vary. For example, the first TFT TR1 and the second TFT TR2 may have a top gate structure, whereas the first TFT TR1 and the second TFT TR2 may have a bottom gate structure in which the first gate electrode 214*a* and the second gate electrode 214*b* are disposed in bottom portions of the first semiconductor active layer 212*a* and the second semiconductor active layer 212*b*. All applicable structures of a TFT may be applied.

The passivation film 218 is formed to cover the first TFT TR1, the capacitor Cst, and the second TFT TR2. The passivation film 218 may be a single or plurality of insulation films, wherein a top surface is even. The passivation film 218 may be formed of an inorganic material and/or organic material.

The first electrode 221 is formed on the passivation film 218 to cover the first TFT TR1, the capacitor Cst, and the second TFT TR2. The first electrode 221 is connected to the second drain electrode 217b of the second TFT TR2. The first electrode 221 is formed in an individual and independent island form according to all pixels as shown in FIG. 7.

The pixel definition film 219f is formed on the passivation film 218 to cover the boundary of the first electrode 221. The intermediate layer 223 including the organic light emitting layer and the second electrode 222 are sequentially stacked on the first electrode 221. The second electrode 222 may be formed throughout the first and second regions 31 and 32.

The first electrode 221 operates as an anode and the second electrode 222 operates as a cathode, or alternatively, polarities of the first and second electrodes 221 and 222 may be changed.

The first electrode 221 has a size corresponding to the first region 31 according to pixels. The second electrode 222 may be a common electrode to cover all pixels.

According to an embodiment, the first electrode 221 may be a reflective electrode and the second electrode 222 may be a transparent electrode. Accordingly, the organic light-emitter 21 is a top emission type realizing an image in a direction of the second electrode 222.

Accordingly, the first electrode 221 may include a reflective film formed of Ag, Mg, Al, Pt, Pd, Au, Ni, Nd, Ir, Cr, Li, Ca, or a compound thereof, and ITO, IZO, ZnO, or $In_2O_3$, which has a high work function. Meanwhile, the second electrode 222 may be formed of a metal having a low work function, such as Ag, Mg, Al, Pt, Pd, Au, Ni, Nd, Ir, Cr, Li, Ca, or an alloy thereof. The second electrode 222 may be formed as a thin film for high transmittance.

As such, when the first electrode 221 is a reflective electrode, the pixel circuit unit PC disposed below the first electrode 221 is covered by the first electrode 221, and thus, a user at an upper outer side of the second electrode 222 is unable to view patterns of the first TFT TR1, the capacitor Cst, and the second TFT TR2, the scan line S, the first data line D, and the first Vdd line V1, which are below the first electrode 221.

Since the first electrode 221 is the reflective electrode, an emitted light is only transmitted to the user, i.e., upward. Thus, the amount of light lost in an opposite direction of the user may be reduced. Also, as described above, since the first electrode 221 covers various patterns of a pixel circuit therebelow, the user is able to view a clear external image As described above, the passivation film 218, the gate insulation film 213, the interlayer insulation film 215, and the pixel definition film 219 may be transparent insulation films to increase transmittance of external light.

Figure 9:
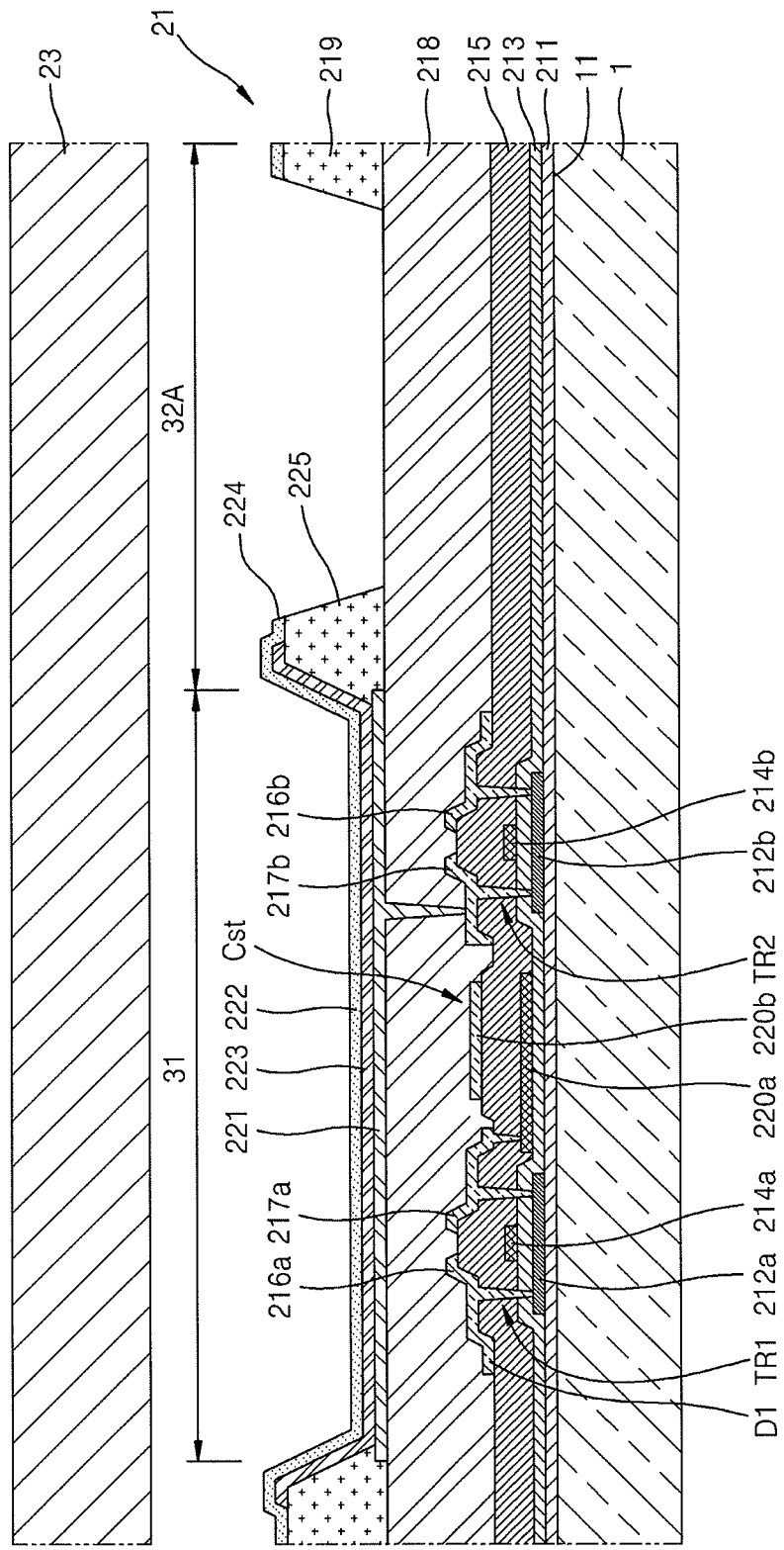
FIG. 9 is a cross-sectional view of a pixel of the organic light-emitter of FIG. 7, according to another embodiment.

Meanwhile, the first penetrating window 224 may be formed in a portion of the second electrode 222 of the second region group A 32A. FIG. 9 is a cross-sectional view of a pixel of the organic light-emitter of FIG. 7, according to another embodiment. The second penetrating window 225 is further formed in the pixel definition film 219. The second penetrating window 225 may be formed by removing a portion of the pixel definition film 219 corresponding to the second region group A 32A. The first and second penetrating windows 224 and 225 may be connected to each other.

Although the first penetrating window 224 is only shown in FIG. 7, the second penetrating window 225 may be formed in the same pattern as the first penetrating window 224.

The second penetrating window 225 may be further formed in at least one of the passivation film 218, the interlayer insulation film 215, the gate insulation film 213, and the buffer film 211. However, the first and second penetrating windows 224 and 225 do not have to exist together, and any one of the first and second penetrating windows 224 and 225 may be formed. Here, only the first penetrating window 224 may be formed so as to increase transmittance of external light.

Present embodiments are not limited thereto, and the first penetrating window 224 and the second penetrating window 225 may be formed by removing predetermined thicknesses of portions of the second electrode 222 and the pixel definition film 219 corresponding to the second region 32 rather than completely removing the portions.

Figure 10:
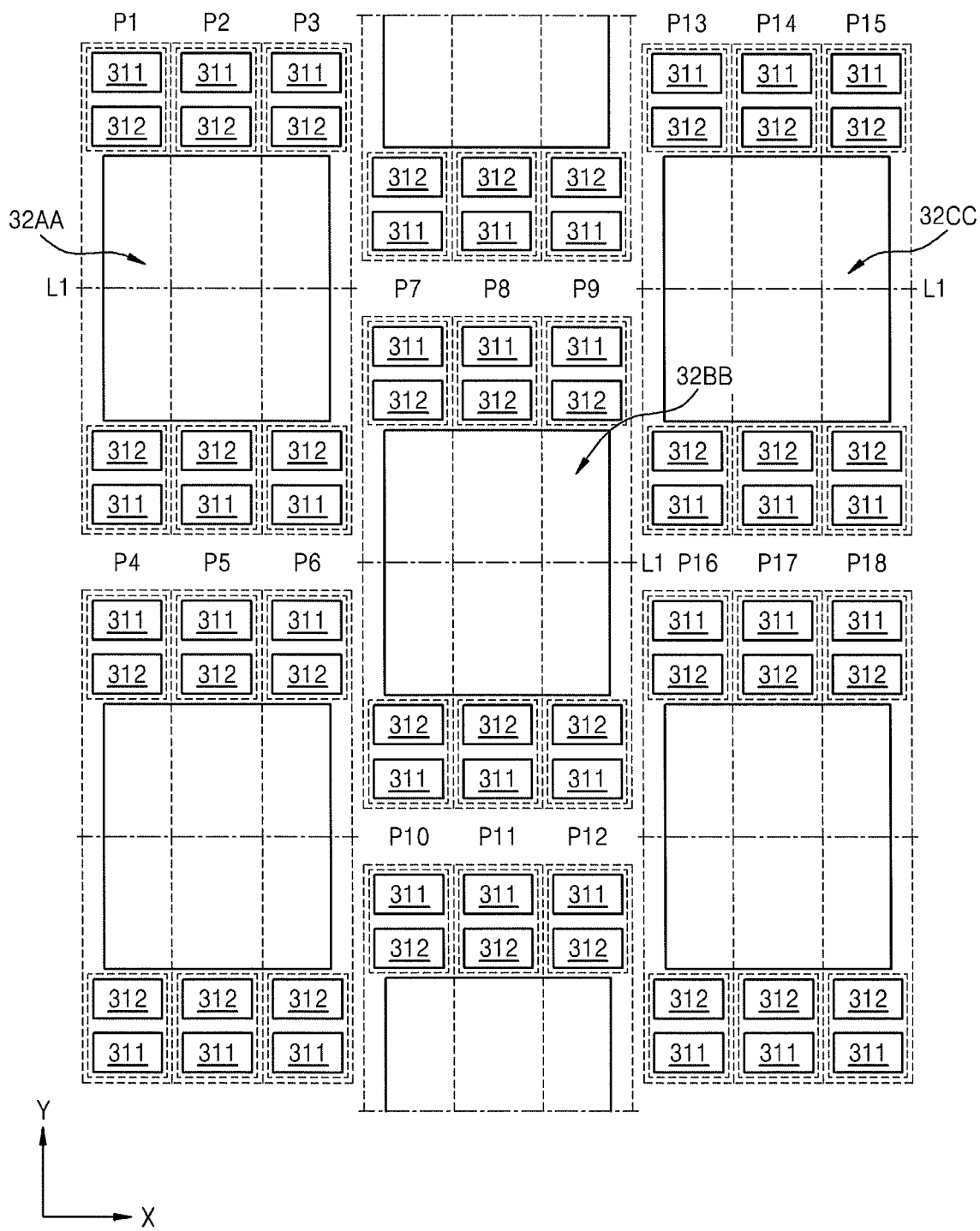
FIG. 10 is a schematic plan view of the organic light-emitter of FIG. 3 or 4, according to another embodiment.

FIG. 10 is a schematic plan view of the organic light-emitter 21 of FIG. 3 or 4, according to an embodiment. More specifically, FIG. 10 is a schematic plan view of the first pixel P1, the second pixel P2, the third pixel P3, the fourth pixel P4, the fifth pixel P5, the sixth pixel P6, the seventh pixel P7, the eighth pixel P8, the ninth pixel P9, the tenth pixel P10, the eleventh pixel P11, the twelfth pixel P12, the thirteenth pixel P13, the fourteenth pixel P14, the fifteenth pixel P15, the sixteenth pixel P16, the seventeenth pixel P17, and the eighteenth pixel P18 of the organic light-emitter 21 that are adjacent to each other.

Each of the first through eighteenth pixels P1 through P18 includes a circuit region 311 and a light-emitting region 312 in the first region 31. The circuit region 311 and the light-emitting region 312 are disposed to be adjacent to each other.

Also, the second regions allowing the external light to penetrate therethrough are disposed to be adjacent to the first regions 31. A plurality of second region groups are formed by integrally connecting the second regions that are adjacent to each other. The second region groups are integrally connected to form second region group sets 32AA, 32BB, and 32CC.

The second region group sets 32AA, 32BB, and 32CC will now be described in detail below.

The first pixel P1, the second pixel P2, and the third pixel P3 are adjacent to each other in a first direction (in an X axial direction of FIG. 10). The second regions included in the first pixel P1, the second pixel P2, and the third pixel P3 are integrally connected to form a second region group. The fourth pixel P4, the fifth pixel P5, and the sixth pixel P6 that are adjacent to the first pixel P1, the second pixel P2, and the third pixel P3 in a second direction (in a Y axial direction of FIG. 10) are adjacent to each other in the first direction. The second regions included in the fourth pixel P4, the fifth pixel P5, and the sixth pixel P6 are integrally connected to form another second region group. The second regions of the first through sixth pixels P1 through P6 are integrally connected to form the second region group set AA 32AA.

A center line L1 of the second region group set AA 32AA may be a boundary of the first pixel P1 and the fourth pixel P4, a boundary of the second pixel P2 and the fifth pixel P5, and a boundary of the third pixel P3 and the sixth pixel P6.

The seventh pixel P7, the eighth pixel P8, and the ninth pixel P9 are adjacent to each other in the first direction (in the X axial direction of FIG. 10). The second regions included in the seventh pixel P7, the eighth pixel P8, and the ninth pixel P9 are integrally connected to form a second region group. The tenth pixel P10, the eleventh pixel P11, and the twelfth pixel P12 that are adjacent to the seventh pixel P7, the eighth pixel P8, and the ninth pixel P9 in the second direction (in the Y axial direction of FIG. 10) are adjacent to each other in the first direction. The second regions included in the tenth pixel P10, the eleventh pixel P11, and the twelfth pixel P12 are integrally connected to form another second region group. The second regions of the seventh through twelfth pixels P7 through P12 are integrally connected to form the second region group set BB 32BB.

The center line L1 of the second region group set BB 32BB may be a boundary of the seventh pixel P7 and the tenth pixel P10, a boundary of the eighth pixel P8 and the eleventh pixel P11, and a boundary of the ninth pixel P11 and the twelfth pixel P12.

The thirteenth pixel P13, the fourteenth pixel P14, and the fifteenth pixel P15 are adjacent to each other in the first direction (in the X axial direction of FIG. 10). The second regions included in the thirteenth pixel P13, the fourteenth pixel P14, and the fifteenth pixel P15 are integrally connected to form a second region group. The sixteenth pixel P16, the seventeenth pixel P17, and the eighteenth pixel P18 that are adjacent to the thirteenth pixel P13, the fourteenth pixel P14, and the fifteenth pixel P15 in the second direction (in the Y axial direction of FIG. 10) are adjacent to each other in the first direction. The second regions included in the sixteenth pixel P16, the seventeenth pixel P17, and the eighteenth pixel P18 are integrally connected to form another second region group. The second regions of the thirteenth through eighteenth pixels P13 through P18 are integrally connected to form the second region group set CC 32CC.

The center line L1 of the second region group set CC 32CC may be a boundary of the thirteenth pixel P13 and the sixteenth pixel P16, a boundary of the fourteenth pixel P14 and the seventeenth pixel P17, and a boundary of the fifteenth pixel P15 and the eighteenth pixel P18.

The second regions are connected to each other throughout six adjacent pixels to form the second region group sets 32AA, 32BB, and 32CC, so that an area of the second regions through which the external light penetrates increases. Thus, transmittance of the display unit 2 may be increased.

The second region group sets 32AA, 32BB, and 32CC are obliquely disposed relative to each other in the first direction. Every second one of the second region group sets 32AA, 32BB, and 32CC are disposed in line with each other in the first direction.

More specifically, the second region group set AA 32AA, the second region group set BB 32BB, and the second region group set CC 32CC are not disposed in line with each other but are disposed obliquely relative to each other. However, the second region group set AA 32AA and the second region group set CC 32CC of every other line are disposed in line with each other. Although not shown in FIG. 10, the arrangement of the second region group set AA 32AA, the second region group set BB 32BB, and the second region group set CC 32CC may be continuously repeated.

The second region group set AA 32AA, the second region group set BB 32BB, and the second region group set CC 32CC that are adjacent to each other in the second direction are disposed in parallel with each other.

In the present embodiment, the second region group set AA 32AA, the second region group set BB 32BB, and the second region group set CC 32CC are disposed obliquely relative to each other in the first direction. In particular, every second one thereof are disposed in line with each other in the first direction. Thus, differences in the spaces therebetween in the first direction and in the second direction are reduced, thereby reducing the image distortion.

By way of summation and review, an organic light-emitting apparatus may include a transparent display apparatus. However, when the organic light-emitting apparatus is used as the transparent display apparatus, a user sees light from the object or the image penetrating through an organic light-emitting device, a transparent thin film transistor (TFT), a pattern of several wires, and a space between the wires. Hence, transmittances of the organic light-emitting diode of the organic light-emitting apparatus, the TFT, and the wires may not be high. In this regard, the space between the wires is very small, contributing to the transmittance of the organic light-emitting apparatus not being high.

In contrast, embodiments are directed to an organic light-emitting display apparatus with improved external light transmittance and image quality.

Exemplary embodiments have been disclosed herein, and although specific terms are employed, they are used and are to be interpreted in a generic and descriptive sense only and not for purpose of limitation.

What is claimed is:

1. An organic light-emitting display apparatus, comprising:
    a substrate;
    a plurality of pixels on a first surface of the substrate, each pixel of the plurality of pixels having a first region and a second region, such that the plurality of pixels provide a plurality of first and second regions, the first region of each pixel being configured to emit visible light defining a displayed image, and the second region of each pixel being configured to transmit external light through an entire thickness of the second region;
    a plurality of pixel circuit units in the first region of each pixel, each pixel circuit unit of the plurality of pixel circuit units including at least one thin film transistor (TFT);
    a plurality of first electrodes independently disposed in the first region of each pixel, each first electrode of the plurality of first electrodes being electrically connected to each pixel circuit unit;
    a second electrode facing the first electrodes, the second electrode being electrically connected throughout the pixels; and
    an intermediate layer including an organic emitting layer between the first electrodes and the second electrode,
    wherein the second regions included in at least two adjacent pixels of the plurality of pixels in a first direction are adjacent to each other and contact each other to define a single transparent region, the single transparent region being a second region group, and a plurality of second region groups being obliquely disposed relative to each other in the first direction.

2. The organic light-emitting display apparatus as claimed in claim 1, wherein every second one of the plurality of second region groups is mutually aligned in the first direction.

3. The organic light-emitting display apparatus as claimed in claim 1, wherein second region groups adjacent to each other in a second direction perpendicular to the first direction are parallel to each other.

4. The organic light-emitting display apparatus as claimed in claim 1, wherein each second region group includes connected second regions of three adjacent pixels in the first direction.

5. The organic light-emitting display apparatus as claimed in claim 1, wherein at least two second region groups adjacent to each other in a second direction perpendicular to the first direction define a plurality of second region group sets.

6. The organic light-emitting display apparatus as claimed in claim 5, wherein the second region group sets are obliquely disposed relative to each other in the first direction.

7. The organic light-emitting display apparatus as claimed in claim 6, wherein every second one of the plurality of second region group sets is mutually aligned in the first direction.

8. The organic light-emitting display apparatus as claimed in claim 6, wherein the second region group sets adjacent to each other in the second direction perpendicular to the first direction are parallel to each other.

9. The organic light-emitting display apparatus as claimed in claim 1, wherein the first electrodes include light penetration electrodes.

10. The organic light-emitting display apparatus as claimed in claim 1, wherein the first electrodes include light reflection electrodes.

11. The organic light-emitting display apparatus as claimed in claim 1, wherein the second electrode includes a plurality of first penetration windows in positions corresponding to the second regions.

12. The organic light-emitting display apparatus as claimed in claim 11, wherein the first penetration windows correspond to the second region groups.

13. The organic light-emitting display apparatus as claimed in claim 12, further comprising at least one insulation film between the substrate and the second electrode,
wherein the insulation film includes a plurality of second penetration windows corresponding to the plurality of second region groups.

14. The organic light-emitting display apparatus as claimed in claim 1, wherein the first region of each pixel includes a light-emitting region and a circuit region, the at least one TFT is disposed in the circuit region, the plurality of first electrodes are disposed in the light-emitting region, and the light-emitting region and the circuit region of each pixel are adjacent to each other.

15. The organic light-emitting display apparatus as claimed in claim 1, wherein the first region of each pixel includes a light-emitting region and a circuit region, the plurality of pixel circuit units are disposed in the circuit region, the plurality of first electrodes are disposed in the light-emitting region, and the light-emitting region overlaps the circuit region to cover the circuit region.

16. The organic light-emitting display apparatus as claimed in claim 15, wherein a first area of each first electrode of each pixel is a same area as a second area of the first region.

17. The organic light-emitting display apparatus as claimed in claim 1, further comprising a display unit on the substrate, the display unit including the plurality of pixels, and external light penetrates through an entire combined thickness of the substrate and display unit in areas corresponding to the second regions of the plurality of pixels.

18. The organic light-emitting display apparatus as claimed in claim 17, wherein the second regions of the pixels include no transistors and no capacitors.

19. The organic light-emitting display apparatus as claimed in claim 4, wherein groups of three pixels are arranged in a plurality of rows and columns, relative orientation of first and second regions along a second direction in each group of three pixels in odd numbered columns being identical, and relative orientation of first and second regions along the second direction in each group of three pixels in even numbered columns being reversed relative to the orientation in the odd numbered columns, the second direction being perpendicular to the first direction.

20. The organic light-emitting display apparatus as claimed in claim 19, wherein each second region group in an even numbered column overlaps a corresponding second region group in an adjacent odd numbered column.

* * * * *